United States Patent [19]

Medernach

[11] Patent Number: 5,277,769
[45] Date of Patent: Jan. 11, 1994

[54] ELECTROCHEMICAL THINNING OF SILICON

[75] Inventor: John W. Medernach, Albuquerque, N. Mex.

[73] Assignee: The United States of America as represented by the Department of Energy, Washington, D.C.

[21] Appl. No.: 798,781

[22] Filed: Nov. 27, 1991

[51] Int. Cl.[5] .................... C25F 3/12; C25F 3/14
[52] U.S. Cl. .................... 204/129.3; 204/129.55; 204/129.65
[58] Field of Search ........... 204/129.3, 129.55, 129.65, 204/153.16

[56] References Cited

U.S. PATENT DOCUMENTS

| | | | |
|---|---|---|---|
| 3,954,523 | 5/1976 | Magdo et al. | 204/129.3 X |
| 3,962,052 | 6/1976 | Abbas et al. | 204/129.3 |
| 4,006,045 | 2/1977 | Aboaf et al. | 204/129.65 X |
| 4,104,090 | 8/1978 | Pogge | 204/129.65 X |
| 4,180,439 | 12/1979 | Deines et al. | 204/1 T |
| 4,303,482 | 12/1981 | Bühne et al. | 204/129.75 X |
| 4,415,414 | 11/1983 | Burton et al. | 204/129.65 X |
| 4,419,813 | 12/1983 | Iwai | 29/576 W |
| 4,510,016 | 4/1985 | Chi et al. | 156/643 |
| 4,626,322 | 12/1986 | Switzer | 204/2.1 |
| 4,798,808 | 1/1989 | Berman | 437/4 |
| 4,874,484 | 10/1989 | Foell et al. | 204/129.3 |
| 5,139,624 | 8/1992 | Searson et al. | 204/129.3 |

OTHER PUBLICATIONS

H. Huannan et al., "Determination of Micro Amounts of Oxygen in Silicon By Inert-Gas Fusion". *Talanta,* vol. 30, No. 10, pp. 761-765, 1983.
W. Gladden et al., "Free Carrier Absorption and Interstitial Oxygen Measurements", National Bureau of Standards, pp. 353-364.
H. Tsuya et al., "Infrared Optical Measurement of Interstitial Oxygen Content In Heavily Doped Silicon Crystals", *Semiconductor Silicon,* 1986, pp. 517-525.
M. Goldstein et al., "The Calibration and Reproducibility of Oxygen Concentration In Silicon Measurements Using Sims Characterization Technique", *Semiconductor Fabrication: Technology and Metrology* ASTM, STP, 990, 1988, pp. 1-11.
P. Chu et al., "Direct Comparison of FTIR and SIMS Calibration For [O] in Silicon", *Materials Research Society Symposia Proceedings,* vol. 59, 1986, Materials Research Society, pp. 65-71.
R. Bleiler et al., "SIMS Measurement of Oxygen In Heavily-Doped Silicon", *Material Research Society Symposium Proc.,* vol. 59, 1986, Materials Research Society, pp. 73-79.
Oates et al., "Infrared Measurements of Interstitial Oxygen In Heavily Doped Silicon", *Journal of Crystal Growth,* 89, 1988, pp. 117-123.
A. Baghdadi et al., "Interlaboratory Determination of the Calibration Factor For The Measurement of the Interstitial Oxygen Content of Silicon By Infrared Absorption", *Journal Electrochemical Society,* vol. 136, No. 7, Jul. 1989, pp. 2015-2024.
F. Schomann et al., "Correction Factors for the Determination of Oxygen in Silicon by IR Spectrometry", *Journal Electrochemical Society,* vol. 136, No. 7, Jul. 1989, pp. 2025-2031.
S. Bains et al., "Oxygen Precipitation in Heavily Doped Silicon", *Journal Electrochemical Society,* vol. 137, No. 2, Feb. 1990, pp. 647-652.
T. Guilinger et al., "Porosity Determinations in Buried and Surface Layers of Porous Silicon", Sandia National Laboratories, Albuquerque, NM.
J. Medernach et al., "The Application of Selective Electrochemical Wafer Thinning for Silicon Characterization", Defects in Silicon II Symposium, Spring ECS Meeting, 1991.

*Primary Examiner*—Donald R. Valentine
*Attorney, Agent, or Firm*—Russell D. Elliott; James H. Chafin; William R. Moser

[57] ABSTRACT

Porous semiconducting material, e.g. silicon, is formed by electrochemical treatment of a specimen in hydrofluoric acid, using the specimen as anode. Before the treatment, the specimen can be masked. The porous material is then etched with a caustic solution or is oxidized, depending of the kind of structure desired, e.g. a thinned specimen, a specimen, a patterned thinned specimen, a specimen with insulated electrical conduits, and so on. Thinned silicon specimen can be subjected to tests, such as measurement of interstitial oxygen by Fourier transform infra-red spectroscopy (FTIR).

18 Claims, 10 Drawing Sheets

ELECTROCHEMICAL THINNING OF SILICON

GOVERNMENT RIGHTS

The United States Government has rights in this invention pursuant to Contract No. DE-AC04-76DP00789 between the United States Department of Energy and the American Telephone & Telegraph Company.

TECHNICAL FIELD OF THE INVENTION

The present invention relates to the field of semiconductor testing, and more particularly to the preparation of silicon wafers, especially n+ or p+ silicon wafers, for the measurement of interstitial oxygen by Fourier transform infra-red spectroscopy (FTIR).

BACKGROUND OF THE INVENTION

In the art of large scale integrated (LSI) devices, the information packing density is constantly increasing. However, with the increasing packing density, certain problems or potential problems may present themselves.

It has been shown that the generation of thermally induced internal microdefects in semiconductors is strongly affected by the type and concentration of dopant, and that oxygen precipitation is drastically suppressed in heavily doped n-type (n+) or p-type (p+) silicon wafers. In this respect, it has been deemed important to measure the interstitial oxygen ($O_i$) non-destructively in heavily doped wafers as well as heat-treated ones in order to understand the formation and behavior of thermally induced microdefects in the wafers.

However, the measurement of interstitial oxygen in silicon materials is not always a straightforward and easily accomplished goal. More specifically, many CMOS processes use epitaxial structures of a lightly doped layer of silicon on a heavily doped substrate to avoid latch-up problems. Typically, epitaxial structures are either n/n+ or p/p+.

Although optical transmittance measurements can be employed to measure interstitial oxygen under certain circumstances in some semiconductors, the interstitial oxygen ($O_i$) of the n+ or p+ substrates, if the substrate is standard (SEMI) thickness, is not easily measured by optical transmittance for resistivities between 0.1 Ohm-cm and 0.02 Ohm-cm and cannot be measured for resistivities less than 0.02 Ohm-cm due to the optical interference of free carrier optical absorption. $O_i$ is measured at 1107 cm$^{-1}$ (9 micrometers) where the localized Si—O bond stretching vibration occurs. Free carrier absorption interference creates problems for both the consumer and the silicon supplier when specifying $O_i$ concentration for n+ or p+ silicon. Furthermore, the inability to measure interstitial oxygen has led to contradictory results in precipitation studies of n+ silicon and to confusion regarding the effects of dopant type and concentration on the $SiO_x$ precipitation in n+ or p+ silicon.

To ensure that the $O_i$ meets the specification of the consumer, most silicon suppliers will grow a dummy ingot of lightly doped silicon (having a resistivity of greater than 1.0 Ohm-cm). Lightly doped silicon does not have the free carrier optical absorption interference, and the $O_i$ can be easily measured. If the $O_i$ of the dummy ingot meets specifications, then the dopant level is increased to meet the consumer resistivity specification, and a new ingot is grown under the same conditions as the dummy ingot. An assumption is made that the $O_i$ will not drastically change during the growth of the new ingot. However, this assumption is not always reliable. It would be desirable, therefore, to have a method of measuring $O_i$ that is reliable for silicon wafers that are heavily doped (having dopant concentrations greater than $10^{17}/cm^3$).

Other methods are known which include the determination of interstitial oxygen implicitly but not explicitly. These methods are for the determination of total oxygen, which includes both interstitial oxygen and substitutional oxygen, in silicon substrates. These methods for determining total oxygen include: secondary ion mass spectrometry (SIMS); vacuum fusion gas analysis; photoactivation analysis combined with gas fusion analysis; electron irradiation; positron annihilation; charged particle analysis; and Fourier transform infra-red spectroscopy (FTIR). The methods that provide total oxygen, as opposed to interstitial oxygen, are obviously not used for interstitial oxygen determinations. Furthermore, the techniques of SIMS, gas fusion, and irradiation are destructive of the samples, and further processing after analysis is impossible.

More specifically with respect to FTIR, FTIR can be used for the direct FTIR measurement of $O_i$ in n+ or p+ silicon. When FTIR is used for the direct FTIR measurement of $O_i$ in n+ or p+ silicon, some form of mechanically thinning of a wafer is always involved. Standard mechanical thinning practice requires that the wafer be sectioned into pieces of approximately 5.0 cm$^2$ in order to maintain flatness and parallelism during the mechanical thinning and polishing processes. Sectioning into smaller pieces destroys substrate integrity and any further processing to produce a LSI or CMOS device is impossible.

A number of significant disadvantages are associated with the mechanical thinning of the silicon wafers. When a particular specimen is mechanically thinned for the FTIR testing to determine $O_i$, too much damage may be done to the specimen which would increase the background noise level of the spectra thereby decreasing the accuracy of the measurement of the $O_i$ band. Thus, it would be desirable to provide a way of thinning a silicon wafer for FTIR testing which permits the tested specimen to be used in further processing steps to produce a LSI or CMOS device, or the like.

Furthermore, when a particular specimen is mechanically thinned for the FTIR testing, free carrier absorption interference can still be a problem. Subsequently, then, irradiation is carried out to neutralize the free carriers. It would be desirable, therefore, to provide a way of thinning a silicon wafer for FTIR testing in which free carrier optical absorption is significantly reduced, whereby there is no need for subsequent irradiation to the neutralize free carriers.

When a particular specimen is mechanically thinned for the FTIR testing, relatively small specimens are needed. However, for many LSI and CMOS devices, the entire wafer of silicon is employed. It is difficult to handle the small pieces of silicon, and it is difficult to subject the small pieces of silicon to mechanical thinning. It would be desirable, therefore, to have a way to prepare silicon samples for FTIR testing for interstitial oxygen without the need to handle and mechanically thin relatively small pieces of silicon.

Accordingly, it is an object of the present invention to provide a method for forming porous semiconductor material on semiconductor substrates.

Another object is to provide a method for selectively thinning semiconductor devices.

Another object is to provide a method for thinning complete integrated circuit chips for application in multichip packaging technology.

Another object is to provide a method for forming insulated electrical path through a thick conductive silicon substrate.

Another object is to provide a method for forming holes in integrated circuit chips, which will serve to align said chips into a three-dimensional package.

Another object is to form vias or holes through a conductive silicon substrate for making electrical connections the front and the back of the substrate.

Another object is to decorate structural grown-in or process induced defects on a silicon wafer.

Another object is to provide a method for preparing silicon samples that permits reliable measurement of interstitial oxygen ($O_i$) in silicon wafers that are heavily doped.

Another object is to provide a method of selective thinning a silicon wafer for FTIR testing which maintains the original dimensions of the tested specimen so further processing steps to produce an LSI or CMOS silicon-based device, or the like, can be carried out.

Another object is to provide a method for determination of interstitial oxygen in silicon that does not require the making and using of dummy ingots.

Another object is to provide a method of thinning a silicon wafer for FTIR testing in which free carrier absorption is significantly reduced, whereby there is no need for subsequent irradiation to the neutralize free carriers.

Another object is to provide a method to conduct FTIR testing for interstitial oxygen without the need to handle and mechanically thin relatively small pieces of silicon.

Additional objects, advantages, and novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention as described herein, a semiconductor specimen, serving as an anode, is treated electrochemically with hydrofluoric acid to form porous semiconductive material over its entire surface or, with masking, over a patterned area on said surface. The porous semiconductor material is then treated with a caustic solution or in an oxidizing atmosphere such as oxygen, air, or the like., according to the application contemplated for the semiconductor specimen. Depending on the particular treatment of the porous semiconducting material and on the masking pattern or absence of masking, there are produced thinned specimens, selectively thinned specimens, specimens with holes, or specimens with insulated conductive vias.

Preferably, the semiconductor specimen is permitted to equilibrate for a predetermined period of time after being subjected to electrochemical action but before removal of the porous semiconductor material.

The thinned semiconductor specimens so obtained, e.g., selectively thinned heavily doped n+ or p+ silicon wafers, can then be subjected to tests, such as measurement of interstitial oxygen by Fourier transform infra-red spectroscopy (FTIR).

The method of the invention works especially well for silicon wafers, and even more so for heavily doped silicon wafers. When the semiconducting material is silicon, the porous silicon is removed, as mentioned above, either by a caustic alkali solution, e.g., between 1 and 7M caustic solution, or by oxidation.

To define areas on the semiconductor specimen that are susceptible to electrochemical action and that are resistant to electrochemical action, a number of methods can be employed. In one method of area definition, an inert electrochemical cell body covers an area on the semiconductor specimen that thereby becomes resistant to electrochemical action, leaving the uncovered area susceptible to electrochemical action.

In another method of area definition, conventional masking techniques can be used. It should be emphasized that the type and order of masking layers necessary to achieve selective thinning are important.

The following detailed description and drawings present, by way of non-limiting illustrations, preferred embodiments of the invention, wherein there is shown and described a preferred embodiment of this invention.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION

Figure 1:
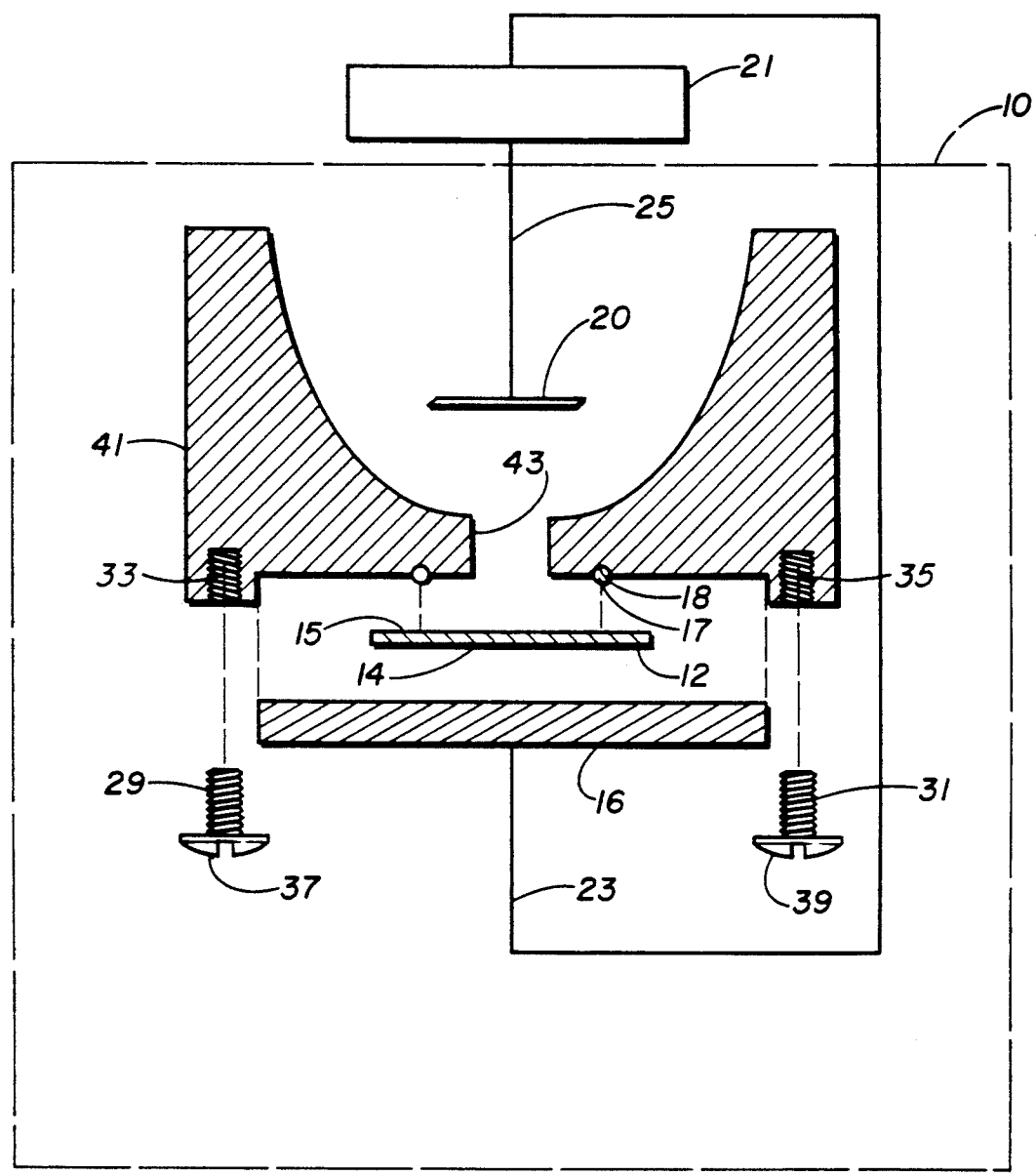
FIG. 1 is an exploded view of an electrochemical cell for carrying out the selective electrochemical thinning methods of the invention.

With reference to the drawings, and more particularly to FIG. 1, there is disclosed an electrochemical cell 10 for carrying out the selective electrochemical thinning methods of the invention. More specifically, a wafer 12 is placed into the electrochemical cell 10, and electrical contact is made to the front surface 14 of the wafer 12 by gold-plated steel disk 16. The area to be selectively electrochemically thinned is defined on the back surface 15 of the wafer 12 by an O-ring 17 which fits into O-ring groove 18. Alternatively, the area to be selectively electrochemically thinned can be defined by photolithographic techniques.

The wafer 12 can be thinned either from the front or back depending on requirements.

The selective electrochemical thinning process of the invention is carried out by selective formation of porous silicon followed by the removal of the porous silicon by a caustic alkali solution. Silicon is made porous by making the silicon the anode of the electrochemical cell 10.

Porous silicon formation is affected by both the type of dopant and the resistivity of the silicon. For example, p-type silicon is more readily anodized than n-type silicon. Also, heavily doped (n+) n type silicon forms porous silicon more readily than lesser doped n-type silicon.

In order for the anodization to occur, holes (h+) are required. The h+ holes are obtained by the following reactions taking place:

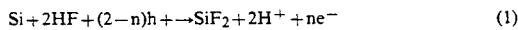

$$Si+2HF+(2-n)h+\rightarrow SiF_2+2H^+ +ne^- \quad (1)$$

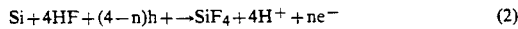

$$Si+4HF+(4-n)h+\rightarrow SiF_4+4H^+ +ne^- \quad (2)$$

Porous silicon is formed with values of n ranging from 2.0 to 3.0 with both reactions (1) and (2) occurring to some extent. A high surface area (40-400 m$^2$/gram) results from a network of interconnecting pores which results from the fact that porous silicon is more chemically reactive than bulk silicon.

In carrying out the electrochemical thinning method of the invention, as stated above, the wafer 12 is placed in the electrochemical cell 10 in contact with the gold-plated steel disk 16. Then, a 1:1 50 wt % HF aqueous or ethanolic solution is poured into the electrochemical cell 10. The wafer 12 acts as the anode, and a platinum or nickel mesh 20 is used as the cathode of the electrochemical cell 10.

Electric power is applied using source 21 either a constant current source or a galvanostate 21, with the current density ranging between 30 and 130 ma/cm$^2$. Conductor 23 connects source 21 to the gold-plated steel disk 16, and conductor 25 connects source 21 to the platinum mesh 20. When the wafer 12 is in place and when the O-ring 17 is in place in the groove 18, then screws 29 and 31 are screwed into threaded holes 33 and 35, respectively to retain the wafer 12 in position in the electrochemical cell 10. The heads 37 and 39 of screws 29 and 31 respectively press up against the back side of the gold-plated steel disk 16 to retain the wafer 12 in position against the O-ring 17 and the HF-resistant cell body 41. An orifice 43 which can be of any dimension depending on the application is present in the cell body 41 permitting an electric field to be established between the platinum mesh 20 and the wafer 12.

The porous silicon formation rate under these conditions varies between 3.0 and 5.0 microns/minute. Layer depth of the porous silicon is determined by applying the electric power for a predetermined period of time. Upon completion of the time period, the porous silicon that is formed is allowed to equilibrate without exposure to electric power for a period of from 30 to 60 minutes, depending on the depth of the porous silicon layer. An alternative layer method for removing the porous silicon layer is to increase the current density by a factor of 4 to 5 at the end of the porous silicon formation cycle. This increase in the current density creates a large stress gradient between the porous silicon layer and the silicon substrate, which causes most of the porous silicon layer to separate from the silicon substrate. The end result is a shorter clean up time.

Then the solution is removed from the electrochemical cell 10, and the wafer 12 is rinsed with distilled water. The wafer 12 is then placed in a container with e.g., 5M NaOH to remove the porous silicon layer. Porous silicon is readily etched with the caustic solution, and due to the high surface area of the porous silicon that was formed, the reaction with the caustic solution can be very active.

Figure 8:
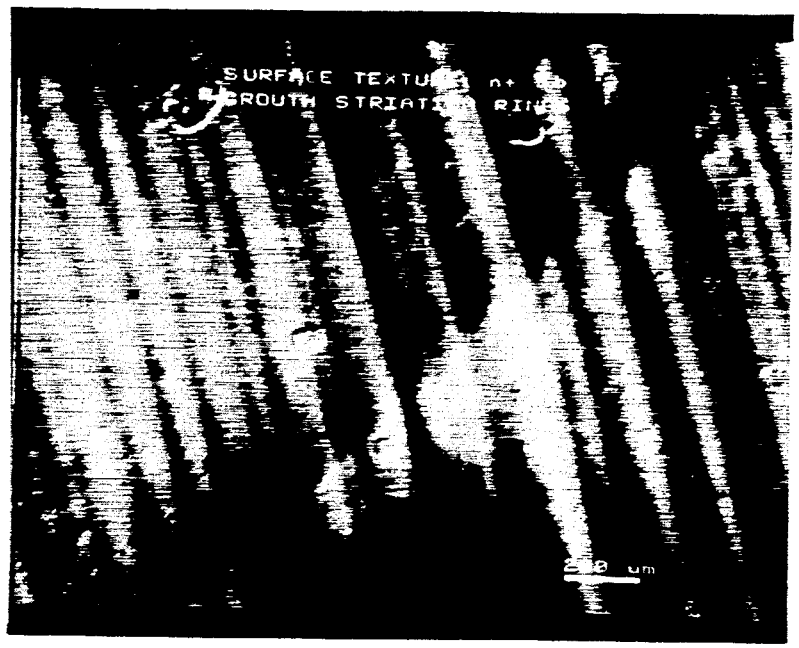
FIG. 8 shows growth striation rings observed on many n+ silicon substrates, orientation <100>.
Figure 9:
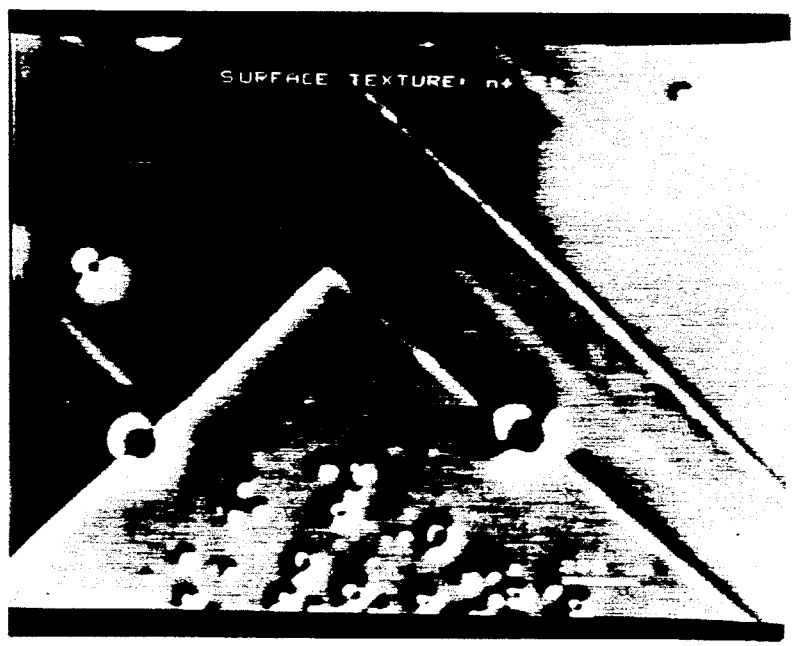
FIG. 9 shows the linear interface features observed on n+ silicon substrates. These features are at an angle of 45° with respect to the main <110> flat.
Figure 10:
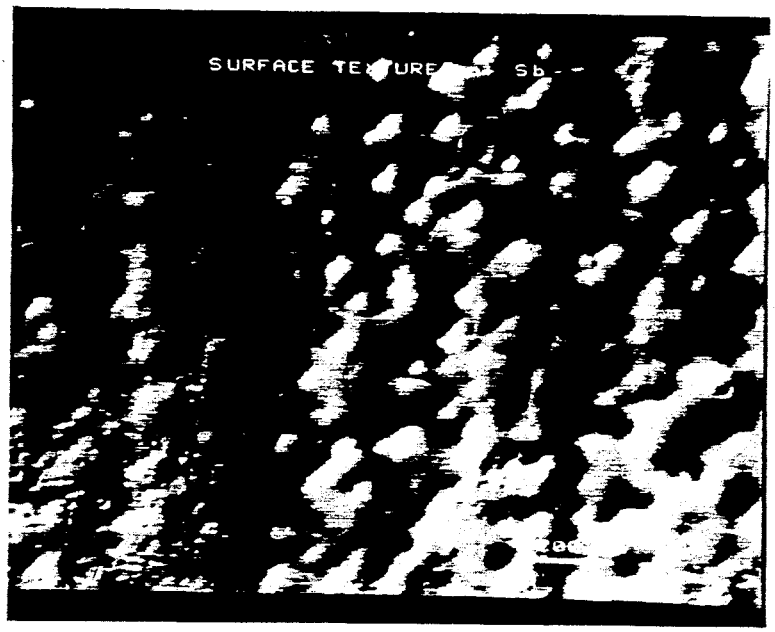
FIG. 10 shows a mound type structure, another surface feature observed on n+ silicon.
Figure 11:
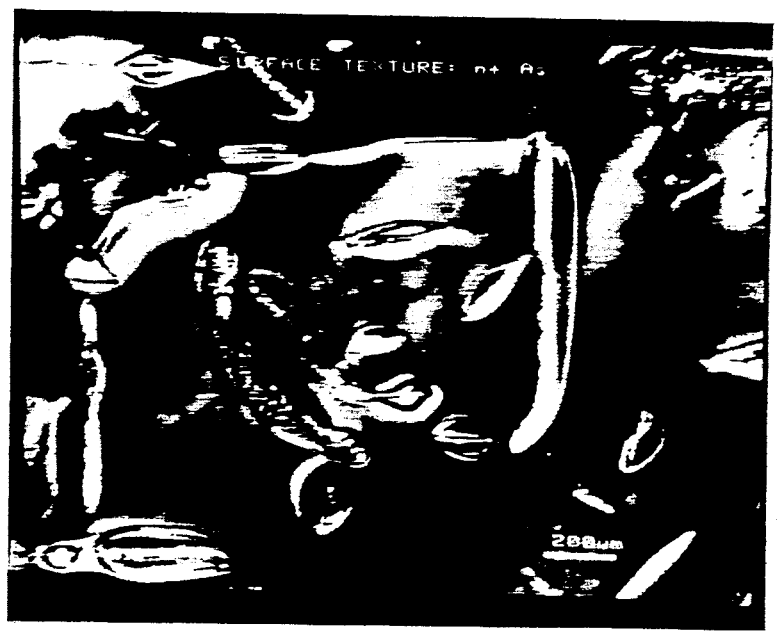
FIG. 11 shows other surface features frequently observed with dopant concentrations $>10^{19}$ atoms/cm$^3$ in the n+ silicon, when the dopant is arsenic.
Figure 12:
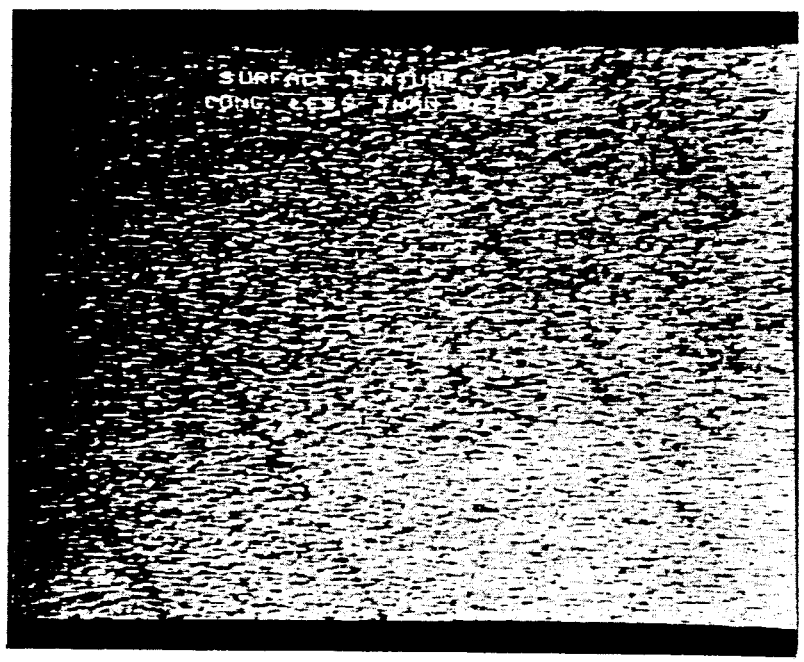
FIG. 12 shows the matte surface observed with lightly doped p-type silicon, $<10^{17}$ atoms/cm$^3$. Also shown is the weakly decorated linear feature at 45° with respect to the major <110> flat.
Figure 13:
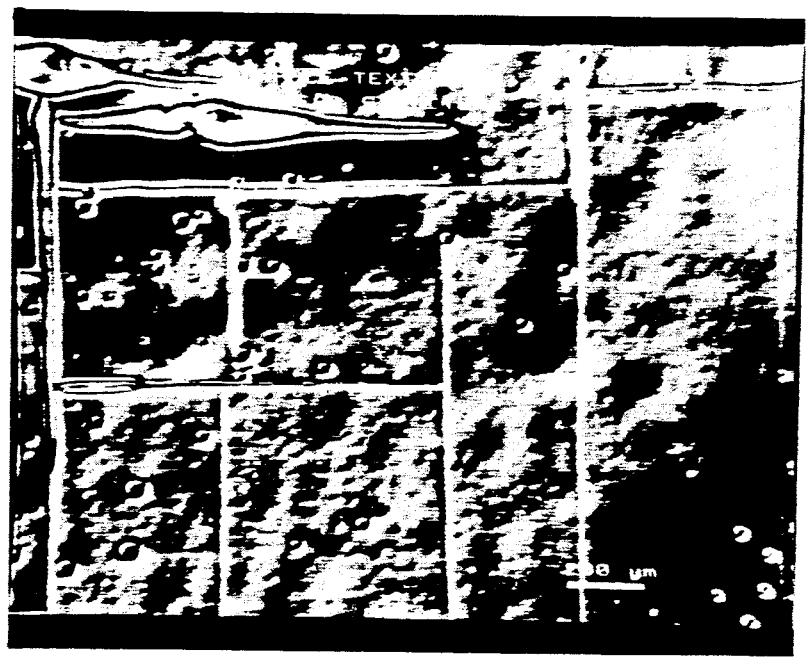
FIG. 13 shows the linear orthogonal features observed in p-type silicon with dopant concentration of $<3\times10^{17}$ atoms/cm$^3$.
Figure 14:
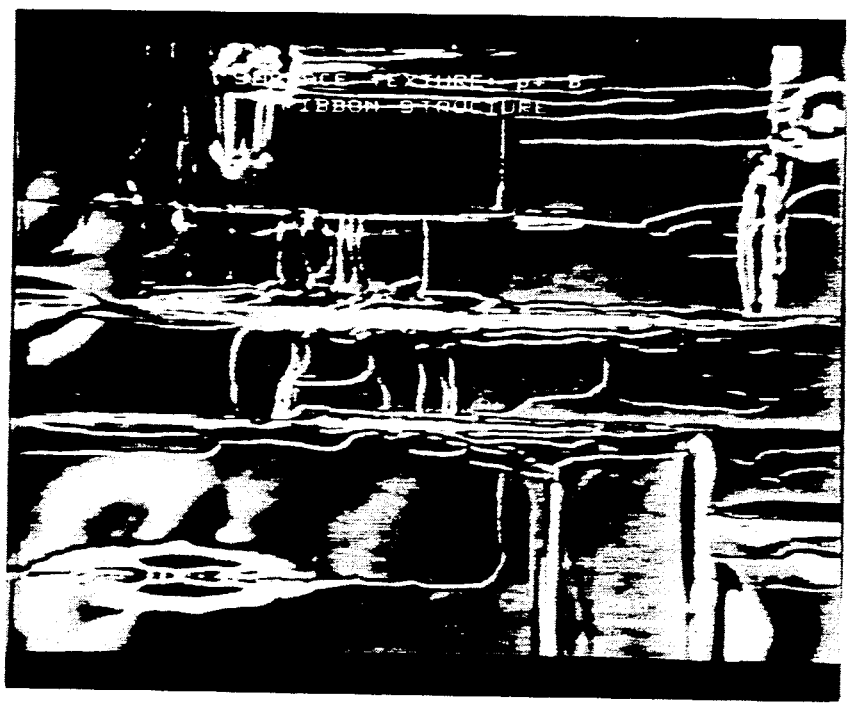
FIG. 14 shows the linear and pseudo-orthogonal features observed in heavily doped p+ silicon, dopant concentration $>10^{18}$ atoms/cm$^3$.

Once the porous silicon is removed by the NaOH, the portion of the wafer 12, from which the porous silicon has been removed, has been selectively electrochemically thinned in accordance with the invention. The surface of the remaining electrochemically thinned area has an electropolished appearance. This effect is observed for selective electrochemical thinning of both the front and back surfaces of the wafer 12. When the selective thinning is performed on the back silicon wafer surface, unique features are decorated as a result of the electrochemical porous silicon formation process. Most noticeable in n+silicon are striation growth rings as shown in FIG. 8 and other linear features which are observed at 45° to the major <110> flat are illustrated in FIG. 9. Other interface features include mound type structures. These are shown in FIG. 10. As the dopant concentration is increased to the range of $>10^{18}$ atoms/cm$^3$ and greater, where arsenic is used as a dopant other structures are decorated, which are shown in FIG. 11. Likewise, the decorated structures observed for p-type silicon are entirely different. Lightly doped p-type shows no positive features which are decorated; only a matte surface is produced after the electrochemical thinning process. A photomicrograph of this feature is shown in FIG. 12. As the dopant concentration is increased to $10^{17}$ atoms/cm$^3$, linear and orthogonal features are observed (FIG. 13), and when the dopant concentration reaches $10^{18}$ atoms/cm$^3$, the range for heavily doped p+silicon, the linear features still exist but now appear to be more of a ribbon type structure. This is shown in FIG. 14.

After removal of the porous silicon layer, the wafer 12 is rinsed and dried and is then ready for FTIR measurement of interstitial oxygen. An electropolished surface is helpful for the FTIR measurement of the interstitial oxygen since it reduces FTIR baseline variations.

Figure 2:
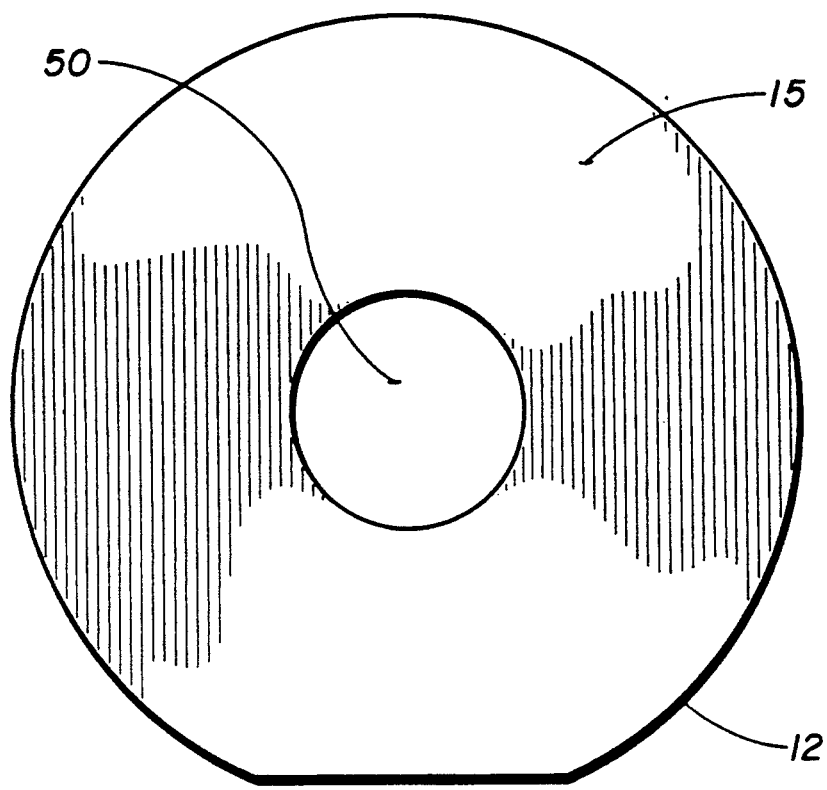
FIG. 2 is a view of the backside of a silicon wafer after the selective electrochemical thinning method of the invention has been carried out in the electrochemical cell shown in FIG. 1.

FIG. 2 shows the backside of wafer 12 after the selective electrochemical thinning method of the invention has been carried out. The area of selective etching is shown as reference numeral 50.

Figure 3:
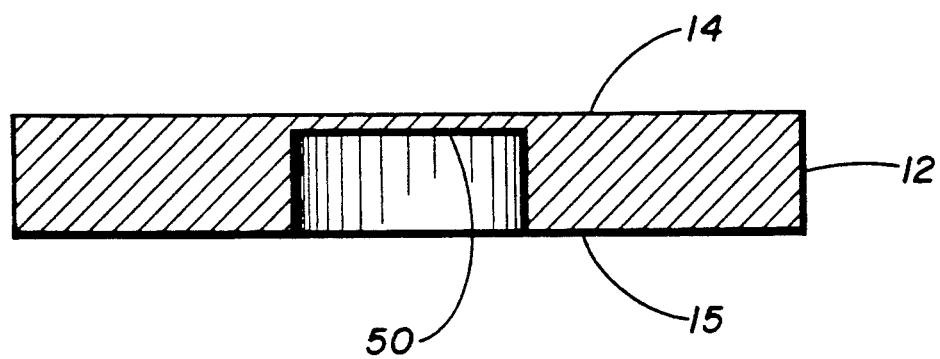
FIG. 3 is a cross-sectional view of the silicon wafer shown in FIG. 2, showing a significant portion of the wafer removed, leaving a thinned region.

FIG. 3 shows a cross-sectional view of the wafer 12 shown in FIG. 2. The front side 14 of the wafer 12 is smooth, and the backside 15 of the wafer 12 has a significant portion removed, leaving a thinned region 50.

Figure 4:
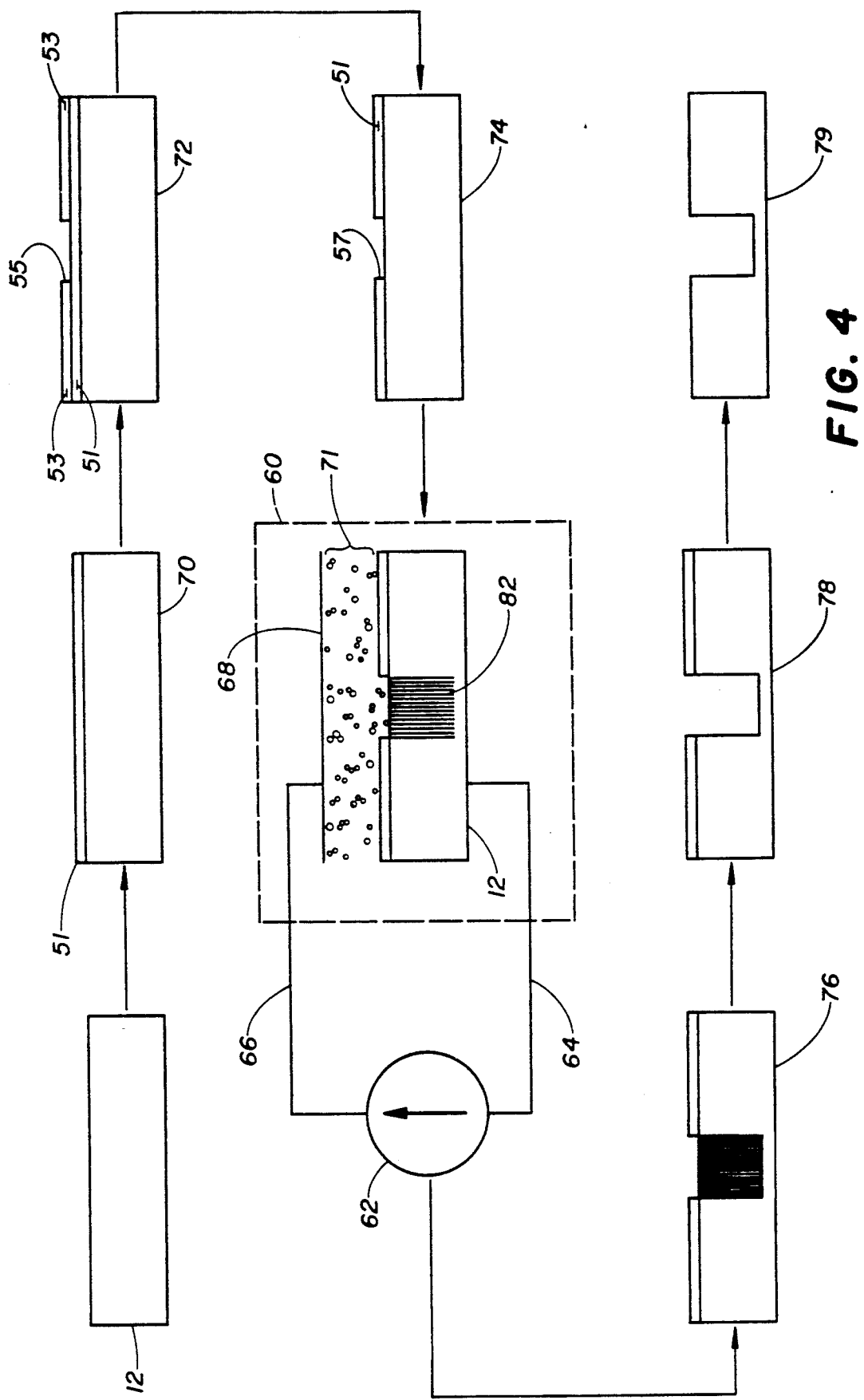
FIG. 4 is a flowchart showing a selective electrochemical thinning method of the invention using a masking technique for defining the region of the silicon wafer to be selectively electrochemically thinned.

Turning to FIG. 4, a flowchart is presented which shows a selective electrochemical thinning method of the invention using a masking technique for defining the region of the silicon wafer to be selectively electrochemically thinned. More specifically, a silicon wafer 12 is masked by deposition of masking layers 51 by conventional masking techniques providing a product 70. The order, type, and thickness of the masking layers is important to achieve proper definition of the area to be thinned. A multi-level mask is employed in order that said mask survive the electrochemical action of the HF over an extended time duration, e.g., 1 to 4 hours. The layer order can be either of the following which is deposited onto the silicon substrate: CVD silicon nitride—polysilicon, or oxide—CVD silicon nitride—polysilicon. The oxide thickness is always <50 nanometers, while the silicon can be in a range from 30 to 120 nanometers, and the polysilicon thickness is usually in a range from 120 to 200 nanometers. A photo resist 53 is applied by conventional techniques to the mask 51, and a window 55 in the photoresist is defined providing a product 72. After the window 55 in the photo resist is defined, the portion of the masking layers 51 under the window 55 is etched away by conventional techniques, and then the photo resist is removed by conventional techniques providing a product 74. At this stage, the masking layer 51 has its own defined window 57.

The silicon wafer 12 with the masking layer 51 having the defined window 57 is then subjected to selective electrochemical thinning in an electrochemical cell 60, shown schematically in FIG. 4 to be comprised of a power source 62, conductor 64 from the power source 62 to the backside of the wafer 12, which serves as the anode, conductor 66 from the power source 62 to a platinum mesh cathode 68. A dilute HF electrolyte 71 occupies the space between the anode and cathode.

During electrolysis, a portion of the silicon under the window 57 is converted to porous silicon 82. After formation of the porous silicon 82, providing a product 76, the porous silicon 82 is removed by contact with a caustic solution (e.g. NaOH) to yield a thinned silicon wafer, providing a product 78, that has a masking layer 51 still thereon. Then, the masking layer 51 is removed by conventional techniques, and the selectively electrochemically thinned silicon wafer 79 of the invention is produced.

This process of selective electrochemical thinning can be applied to the back of a processed silicon wafer or to silicon chip which have defined and operational integrated circuit (IC) devices. The object is to protect the front surface which has the operational IC device with a HF-resistant coating. Electrical contact is made along the perimter of the chip or the circumference of the wafer. The electrochemical thinning process proceeds as previously described for a predetermined time. The porous silicon layer also is removed as described in the previous section. Improvements are reduced contamination, attenuated wafer breakage, and no lapping damage. Existing IC technology which process silicon wafers of diameters>100 mm use some form of mechanical lapping or chemical etching to thin the silicon wafers. Thinning is used so IC chips when bonded into a package will have clearance for the wire bonds. Wafer and chip thinning by electrochemical action is faster, and there is less chance for particulate or metallic contamination.

The major concern of using this technique was the series resistance from the edge of the wafer to its center would create a thickness gradient. That is more silicon would be removed at the edge of a wafer than at the center. This is not the case for heavily doped silicon.

Another application of the use of selective electrochemical thinning is the formation of an insulated electrical path through a thick conductive silicon substrate. This is achieved by employing the multi-level masking described in a previous section and the electrochemical action necessary to form porous silicon in selective areas. The mask is in the form of an annulus. The wafer can be patterned either on one side or two, and illumination during the electrochemical action is dependent on the substrate resistivity. The object is to form a thin annular ring of porous silicon through the thick silicon substrate. This porous silicon ring is then treated at low temperature, preferably between about 600° and 900° C., in an oxidizing atmosphere to form an insulating layer between the conductive silicon substrate and the inner conductive silicon cylinder. This treatment can be done in any conventional oxidizing atmosphere, although oxygen is preferred. The advantage in this process is to permit the formation of electrical paths from the front to the back of a silicon wafer or chip. This type of interconnect has application in high density electronics packaging technologies, and leads to the elimination of wire bonds and their associated reliability problems. A through-the-wafer interconnect system can be made to be self-aligned, so other chips with the same configuration can be used to build 3-D structures.

Figure 5:
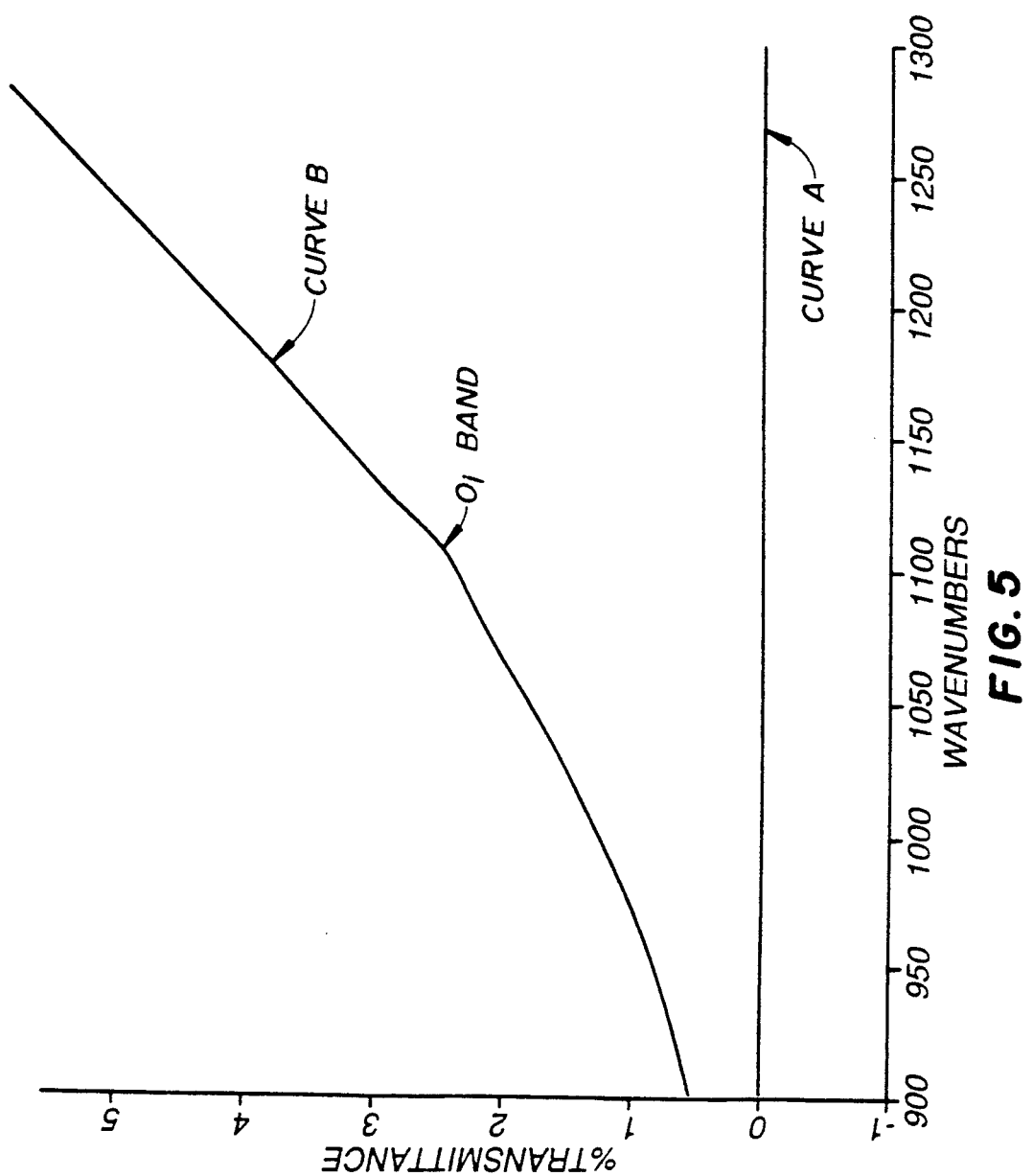
FIG. 5 is a curve showing transmittance versus wavenumbers for a silicon sample that is electrochemically thinned in accordance with the invention.
Figure 6:
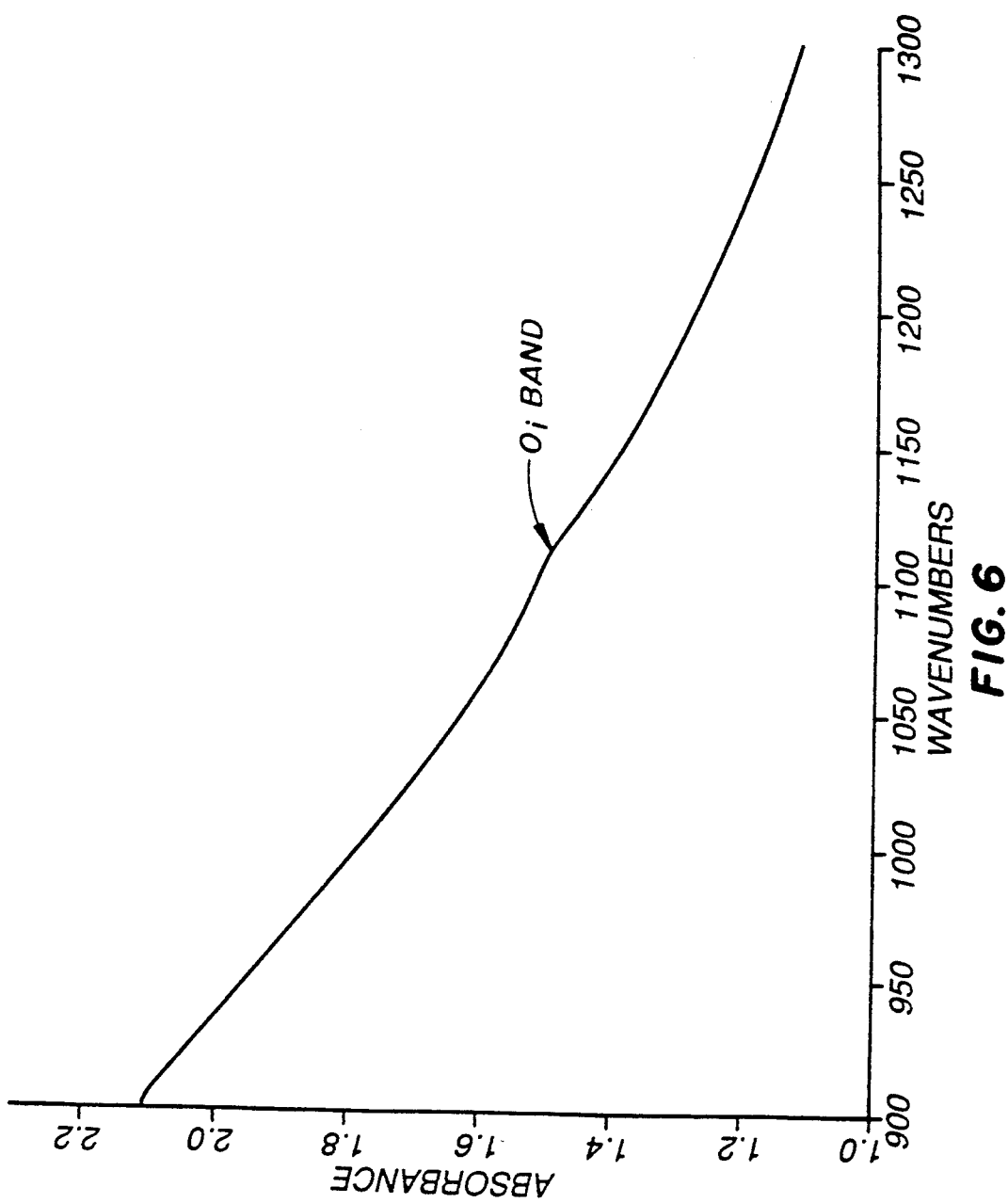
FIG. 6 is a curve, based on the transmittance curve shown in FIG. 5, showing absorbance versus wavenumbers for the electrochemically thinned silicon sample of FIG. 5.
Figure 7:
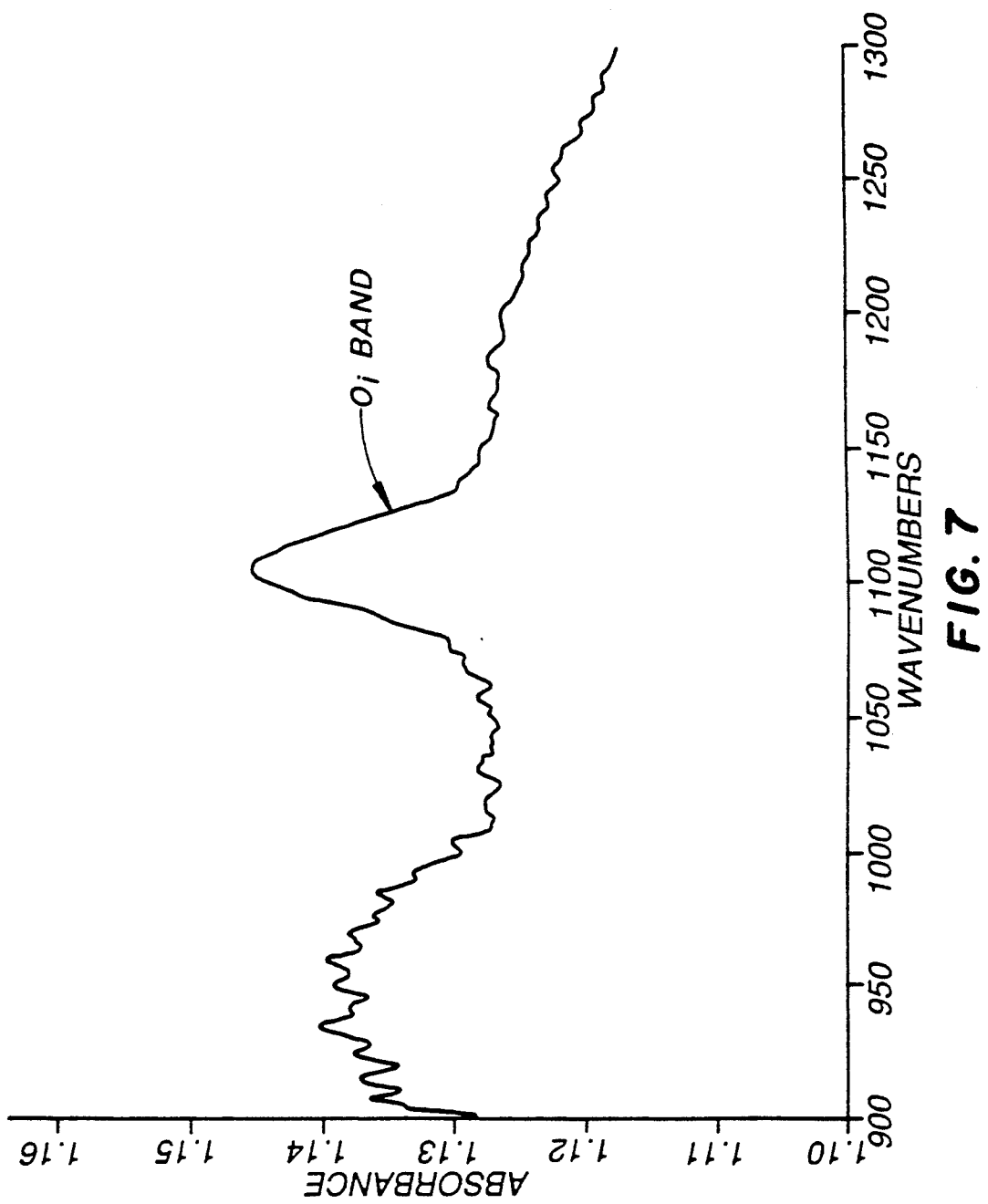
FIG. 7 is a curve, based on the absorbance curve shown in FIG. 6, showing absorbance versus wavenumbers with quadratic baseline correction.

The effectiveness of the selective electrochemical thinning method of the invention is shown in FIGS. 5-7.

In FIG. 5, curve A is the IR spectra of an n+ (heavily doped) silicon substrate with a thickness of 625 microns. The interstitial oxygen content of the n+ silicon cannot be determined under this condition as indicated by the horizontal nature of curve A. However, taking the same silicon substrate and selectively thinning it to a thickness of 161 microns by the selective electrochemical thinning method of the invention, significant IR transmittance is observed as indicated in curve B of FIG. 5. It is noted that there is a small absorption band at 1107 cm$^{-1}$. One can convert the transmittance to absorbance A by the following relation: $A = \ln(1/T)$.

In FIG. 6, the spectra of the thinned region, shown as transmittance curve B in FIG. 5, is shown as a curve converted to absorbance units. In FIG. 6, a positive absorption band is observed at 1107 cm$^{-1}$.

In FIG. 7, a quadratic baseline correction is made for the curve shown in FIG. 6. It is clear that the interstitial oxygen band at 1107 cm$^{-1}$ is directly observed. It is noted that the larger band between 900 and 1000 cm$^{-1}$ is due to phonon absorption.

Wafers are selectively electrochemically thinned in accordance with the invention to a thickness of 125 micrometers with an area of 5 cm² without any difficulty. Selectively electrochemically thinned areas have sufficient thickness variations such that optical interference effects are not pronounced and do not cause any difficulty in determining peak location. It is noted that the wafer 12 should be allowed to equilibrate after the thinning process for a sufficient time.

All silicon wafers used in the embodiments described herein are <100> orientation, 100 mm in diameter with a thickness of 625 micrometers. However, other orientations such as <111> and <110> also can be used. Resistivities ranged between 0.008 Ohm-cm to 2.00 Ohm-cm and included p−, p+, or n+ type silicon. The wafers were rated as either high or medium oxygen content silicon. Low oxygen content silicon also can be used. Larger diameter silicon wafers can be used, such as 150 mm, 200 mm, and more, while the thickness can be in a wide range, e.g., from 400 to 800 micrometers and higher.

An ADE Model 7000 wafer inspection system was used to measure thickness by a non-contact method at three locations in the selective electrochemical thinning areas on the wafers. Nicolet Models 60SX with a MCT detector and an ECO-8 FTIR spectrometers were used for room temperature transmittance measurements. A resolution of 4 cm$^{-1}$ was used through the 900 to 1300 cm$^{-1}$ frequency range for the interstitial oxygen determination. In some cases, an optical filter was inserted to pass energy only through the part of the spectrum needed for calculating $O_i$. The $O_i$ values were determined using both ASTM F1188.88 standard test method and the short baseline technique reported by Oates and Lin, and the IOC-88 calibration factor was used for all calculations. Oxygen reference wafers (supplied by Siltec Silicon) was used to validate our methods for calculating the $O_i$ values by comparing the calculated values with those of the supplier. $O_i$ values for the oxygen reference material were calculated using ASTM F1188-88 standard test method and were referenced against a float zone (FZ) standard wafer with a resistivity > 100 ohm-cm. However, an air reference method was used for the thinned samples because thin FZ standards were not available. Some of the oxygen reference wafers and electrochemically thinned samples analyzed for total oxygen $O_t$ by Secondary Ion Mass Spectrometry (SIMS) are also provided for comparison with the selective electrochemical thinning method of the invention.

The $O_i$ calculated from FTIR measurements on the oxygen reference wafers used in this study, as stated above, are listed in Table I. Reference wafers 4A and 4M have thicknesses of 499 micrometers and 2000 micrometers, respectively, and were cut from the same region of the silicon ingot. The good agreement between the cited, and calculated $O_i$ values and the $O_t$ values obtained by SIMS indicates the consistency of the method of the invention for interstitial oxygen determination. The calculated $O_i$ concentrations obtained on the reference wafers are within 10 percent of the values given by the supplier for these wafers.

The $O_i$ concentrations determined from the electrochemically thinned samples are compared to the total oxygen concentrations determined by SIMS. This information, which is given in Table II, shows very good agreement. This agreement between FTIR and SIMS results demonstrates the applicability of wafer thinning for $O_i$ determination in heavily doped silicon.

The applicability of the selective electrochemical thinning methods of the invention to facilitate FTIR transmittance measurements at room temperature in n+ and p+ silicon is shown for sample SB4 (0.0138 ohm-cm), P10 (0.0089 ohm-cm), and 143 (0.0143 ohm-cm). An advantage of the selective electrochemical thinning methods of the invention over mechanical thinning for the determination of $O_i$, in addition to lower cost and less processing time, is that all wafer dimensions are maintained except in the thinned area.

The limits in dopant concentration, in the interstitial oxygen, and the thickness of the silicon sample for the application of the selective electrochemical thinning methods of the invention have yet to be determined.

TABLE I

| | | OXYGEN REFERENCE CORRELATION | | | | |
|---|---|---|---|---|---|---|
| | | RESISTIVITY | FTIR $O_i$ (ppma) | | | THICKNESS |
| ID | TYPE | OHM-CM | Cited | 60SX | ECO-8 | SIMS | MICRONS |
| 4A | p− | 2.40 | 23.64 | 21.68 | 20.90 | 20.70 | 499 |
| 4M | p− | 2.40 | 25.07 | 22.08 | — | — | 2000 |
| 34 | p− | 13.15 | 19.07 | 18.07 | 17.80 | 17.90 | 478 |
| 13 | p− | 21.60 | 21.40 | 21.00 | 19.15 | 22.80 | 438 |
| L2 | p− | 6.44 | 16.62 | 16.83 | 17.14 | 16.00 | 598 |
| FZ | n− | >100.00 | 1.00 | 0.84 | — | 1.30 | 680 |
| 05 | p− | 16.94 | 16.26 | 16.40 | 16.14 | 16.00 | 471 |

TABLE II

| | | COMPARISON $O_i$ MEASUREMENTS FOR ELECTROCHEMICAL THINNED SAMPLES | | | | |
|---|---|---|---|---|---|---|
| | | RESISTIVITY | FTIR $O_i$ (ppma) | | $O_t$ by SIMS | THICKNESS |
| ID | TYPE | OHM-CM | 60SX | ECO-8 | (ppma) | MICRONS |
| SB4 | n+ | 0.0138 | 15.79 | 16.12 | 17.70 | 161 |
| P10 | p+ | 0.0089 | 15.78 | 15.80 | 18.60 | 390 |
| 143 | n+ | 0.0143 | 14.35 | 14.25 | 15.30 | 112 |
| HO2 | n+ | 0.0170 | 22.92 | 22.04 | 23.20 | 125 |
| MO2 | n+ | 0.0160 | 19.18 | 18.93 | 21.00 | 130 |
| DSP | p− | 2.2600 | 22.17 | 22.20 | 23.80 | 485 |

The interstitial oxygen values (FTIR $O_i$) are calculated using the short baseline method of Oates and Lin. This method is similar to the ASTM F1188-88 standard test method, but was developed for heavily doped silicon, which is not handled well by the ASTM method.

Good agreement is observed between the total oxygen SIMS measurements and the $O_i$ FTIR measurements. In the examples in Table II, the $O_i$ measured by FTIR is smaller, which is expected, since the total oxygen measured by SIMS is the sum of the $O_i$ and the substitutional oxygen.

Still another comparison has been made between $O_i$ determined before and after selective electrochemical thinning methods. Reference is made to Table III for additional comparison data.

In Table III, there is excellent correlation between the interstitial oxygen calculated from spectra taken before any electrochemical thinning and from a spectrum obtained in the thinned region of the same wafer. There is a 62% reduction in the thickness of the wafer and the agreement is within 2%, which is within the precision of the measurement. This further demonstrates the capability of the invention by substantially reducing the wafer thickness and not reducing the precision of the calculation. Finally, $O_i$ was determined from the FTIR spectra using the short baseline method. Other samples include both p− and p+ silicon illustrating the versatility of the electrochemical thinning process of the invention.

TABLE III

| COMPARISON $O_i$ VALUES BEFORE AND AFTER THINNING | | | | | |
|---|---|---|---|---|---|
| ID | TYPE | RESISTIVITY OHM-CM | FTIR $O_i$ 60SX | (ppma) ECO-8 | THICKNESS MICRONS |
| 43U | n+ | 0.0304 | 18.88 | 18.84 | 673.3 before thinning |
| 43T | n+ | 0.0304 | 18.44 | 18.50 | 255.0 after thinning |

With the selective electrochemical thinning methods of the invention, the time required to prepare a sample for $O_i$ FTIR. With the selective electrochemical thinning methods of the invention, the time required to prepare a sample for $O_i$ FTIR measurement is less than 6 hours. This time is considerably less than the 24 to 48 hours required for thinning by mechanical means (e.g. lapping and/or double side polishing).

In summary, numerous benefits have been described which result from the application of the principles of the invention. For instance, a selective region of a silicon wafer can be thinned, while the remaining area of the wafer will support the thinned area. The original wafer diameter and thickness are maintained, except for the thinned area. Then, after the thinning process and after the FTIR testing for interstitial oxygen, the entire wafer can be further processed to form an LSI or CMOS device or the like. The interstitial oxygen ($O_i$) can be measured reliably in silicon wafers that are heavily doped. No dummy ingots are required. There is no need to handle and thin relatively small pieces of semiconductor material mechanically. A selective electrochemical thinning technique can be developed using a silicon wafer as a packaging media substrate. Selective electrochemical thinning can be used for preparation of stress free silicon membranes for x-ray lithography masks. A method is disclosed, as well, which uses precision selective electrochemical porous substrate formation with subsequent oxidation and photolithography techniques to form insulated electrical paths through a conductive substrate. This capability can provide a back contact for integrated circuit chips, eliminating wire bonds. Electrochemical thinning can be carried out on a wafer scale, resulting in the thinning of an entire silicon wafer after IC processing. Unique surface features can be decorated, whether they be source, grown-in, or process induced. An entire silicon wafer or IC chip can be thinned without mechanical lapping and polishing.

Furthermore, the process of the invention allows the thinning of silicon wafers for FTIR testing with significantly reduced free carrier absorption, so that there is no need for subsequent irradiation to the neutralize free carriers.

Obvious modifications or variations of the processes of the invention can be devised by those skilled in the art in the light of the above teachings. The embodiments described were chosen to illustrate the principles of the invention and its practical application in order to facilitate the use of the invention and the modifications necessary to adapt it to the particular uses contemplated. It is intended that the scope of the invention be limited only by the following claims.

What is claimed is:

1. A method for preparing a semiconductor specimen, comprising the steps of:
   defining a region on a surface of a semiconductor specimen that is resistant to electrochemical action and defining a region on the surface of the semiconductor specimen that is susceptible to electrochemical action,
   subjecting the semiconductor specimen to electrochemical action, wherein the semiconductor specimen serves as an anode, such that porous semiconductor material is formed in the defined region that is susceptible to electrochemical action, and
   removing the porous semiconductor material from the semiconductor specimen, leaving a portion of the semiconductor specimen that is thinned.

2. The method of claim 1, wherein said porous semiconductor material is formed by subjecting said semiconductor specimen to electrochemical action in an ethanolic hydrofluoric acid bath in which the specimen serves as an anode.

3. The method of claim 1, wherein the porous semiconductor material formed is chemically removed, leaving a thinned specimen.

4. The method of claim 3, wherein the porous material is removed by subjection to an oxidizing atmosphere.

5. The process of claim 4 wherein the porous material is removed by subjection to oxygen at a temperature within the range of about 600° to 900° C.

6. The method of claim 1, wherein the specimen is an integrated circuit chip.

7. The method of claim 1, wherein the semiconductor specimen is heavily doped silicon.

8. The method of claim 1 wherein the semiconductor specimen is gallium arsenide.

9. The method of claim 1, wherein the region of the surface of the semiconductor specimen that is resistant to electrochemical action is defined by an inert portion of an electrochemical cell.

10. The method of claim 1, wherein the region of the surface of the semiconductor specimen that is resistant to electrochemical action is defined by conventional masking techniques.

11. The method of claim 1, further including the step of permitting the semiconductor specimen to equilibrate for a predetermined period of time after subjection to electrochemical action but before removing the porous semiconductor material from the semiconductor specimen.

12. The method of claim 1, wherein the porous silicon is removed by a caustic solution.

13. The method of claim 1, wherein the semiconductor specimen is made from heavily doped silicon having dopant concentrations greater than $10^{17}/cm^3$.

14. The method of claim 1, wherein the semiconductor specimen is prepared for Fourier transform infrared spectroscopy (FTIR).

15. A method for preparing a silicon specimen, comprising the steps of:
   defining a region on a surface of a silicon specimen that is resistant to electrochemical action and defining a region on the surface of the silicon specimen that is susceptible to electrochemical action,
   subjecting the silicon specimen to electrochemical action, wherein the silicon specimen serves as an anode, such that porous silicon material is formed in the defined region that is susceptible to electrochemical action,
   permitting the silicon specimen to equilibrate for a predetermined period of time after formation of the porous silicon material, and
   removing the porous silicon material from the silicon specimen with a caustic solution, leaving a portion of the silicon specimen that is thinned.

16. A silicon specimen made by a method comprising the steps of:
   defining a region on a surface of a silicon specimen that is resistant to electrochemical action and defining a region on the surface of the silicon specimen that is susceptible to electrochemical action,
   subjecting the silicon specimen to electrochemical action, wherein the silicon specimen serves as an anode, such that porous silicon material is formed in the defined region that is susceptible to electrochemical action,
   permitting the silicon specimen to equilibrate for a predetermined period of time after formation of the porous silicon material, and
   removing the porous silicon material from the silicon specimen with a caustic solution, leaving a portion of the silicon specimen that is thinned.

17. A method of measuring interstitial oxygen in a semiconductor specimen, comprising the steps of:
   defining a region on a surface of the semiconductor specimen that is resistant to electrochemical action and defining a region on the surface of the semiconductor specimen that is susceptible to electrochemical action,
   subjecting the semiconductor specimen to electrochemical action, wherein the semiconductor specimen serves as an anode, such that porous semiconductor material is formed in the defined region that is susceptible to electrochemical action,
   removing the porous semiconductor material from the semiconductor specimen, leaving a portion of the semiconductor specimen that is thinned, and
   determining interstitial oxygen by subjecting the thinned portion of the semiconductor specimen to Fourier transform infra-red spectroscopy (FTIR).

18. The method of claim 17, wherein the silicon specimen is allowed to equilibrate for a predetermined period of time after formation of the porous silicon material.

* * * * *